(12) United States Patent
Freuler et al.

(10) Patent No.: US 7,056,566 B2
(45) Date of Patent: *Jun. 6, 2006

(54) PREAPPLIABLE PHASE CHANGE THERMAL INTERFACE PAD

(75) Inventors: Raymond G. Freuler, Laguna Hills, CA (US); Gary E. Flynn, Coto de Caza, CA (US)

(73) Assignee: Henkel Corporation, Rocky Hill, CT (US)

(*) Notice: Subject to any disclaimer, the term of this patent is extended or adjusted under 35 U.S.C. 154(b) by 0 days.

This patent is subject to a terminal disclaimer.

(21) Appl. No.: 10/643,401

(22) Filed: Aug. 19, 2003

(65) Prior Publication Data

US 2004/0052998 A1 Mar. 18, 2004

Related U.S. Application Data

(63) Continuation of application No. 09/572,353, filed on May 17, 2000, now Pat. No. 6,616,999.

(51) Int. Cl.
*B32B 33/00* (2006.01)
*B32B 23/02* (2006.01)
*H01L 23/26* (2006.01)

(52) U.S. Cl. .......... 428/40.1; 428/41.4; 428/192; 428/343; 428/344; 174/16.3; 174/138 G; 361/697; 257/712; 257/717; 257/718; 257/719; 165/104.19; 165/185

(58) Field of Classification Search ............ 428/40.1, 428/41.4, 192, 343, 344, 118, 34.9, 209, 220; 174/16.3, 138 G, 52.4, 659; 361/690–697, 361/702–719, 306.2, 321.1; 257/712, 717, 257/718, 719, 666, 678, 707–713, 692, 737; 165/104.19, 84, 185, 80.3, 80.4; 156/89.24, 156/250, 247, 89.23, 346
See application file for complete search history.

(56) References Cited

U.S. PATENT DOCUMENTS 2,799,793 A 7/1957 De Cain
2,887,628 A 5/1959 Zierdt, Jr.

(Continued)

FOREIGN PATENT DOCUMENTS

CA 600823 6/1960

(Continued)

OTHER PUBLICATIONS

Power Devices, Inc.; "Kapton MT Substrate Coated with High Performance Thermal Compound in Easy-to-Use Form"; MCM-Strate; 1996.

(Continued)

*Primary Examiner*—Harold Pyon
*Assistant Examiner*—Patricia L. Nordmeyer
(74) *Attorney, Agent, or Firm*—Steven C. Bauman

(57) ABSTRACT

A thermal interface for facilitating heat transfer from an electronic component to a heat sink. According to a preferred embodiment, the thermal interface comprises a first planar substrate that defines a first continuous peripheral edge, at least a portion of which extends beyond the interface mating surface between the electronic component and heat sink. Formed upon opposed sides of the substrate are layers of thermally conductive compositions, which preferably comprise certain novel graphitic allotrope compounds. The thermal interface further includes an adhesive deposited upon such portion of the peripheral edge extending beyond the mating surface between the electronic component and heat sink such that the thermal interface may be adhesively secured into position without forming an additional layer at the mating juncture between the electronic component and the heat sink.

13 Claims, 1 Drawing Sheet

U.S. PATENT DOCUMENTS

| | | | |
|---|---|---|---|
| 3,013,104 A | 12/1961 | Young |
| 3,249,680 A | 5/1966 | Sheets et al. |
| 3,356,828 A | 12/1967 | Furness |
| 3,391,242 A | 7/1968 | Sudges |
| 3,463,140 A | 8/1969 | Rollor, Jr. |
| 3,463,161 A | 8/1969 | Andrassy |
| 3,467,547 A | 9/1969 | Harvey et al. |
| 3,476,177 A | 11/1969 | Potzi |
| 3,586,102 A | 6/1971 | Gilles |
| 3,603,106 A | 9/1971 | Ryan |
| 3,819,530 A | 6/1974 | Ratledge et al. |
| 3,823,089 A | 7/1974 | Ryan et al. |
| 3,887,628 A | 6/1975 | Beckers |
| 3,972,821 A | 8/1976 | Weidenbenner et al. |
| 4,065,908 A | 1/1978 | Mueller |
| 4,151,547 A | 4/1979 | Rhoades et al. |
| 4,199,548 A | 4/1980 | Raiho et al. |
| 4,237,086 A | 12/1980 | Gehle |
| 4,266,267 A | 5/1981 | Ruegg |
| 4,299,715 A | 11/1981 | Whitfield et al. |
| 4,360,626 A | 11/1982 | Manwiller |
| 4,466,483 A | 8/1984 | Whitfield et al. |
| 4,473,113 A | 9/1984 | Whitfield et al. |
| 4,489,487 A | 12/1984 | Bura |
| 5,002,715 A | 3/1991 | Grapes et al. |
| 5,237,086 A | 8/1993 | Kruger et al. |
| 5,904,796 A | 5/1999 | Freuler et al. |
| 5,912,805 A | 6/1999 | Freuler et al. |
| 5,930,893 A | 8/1999 | Eaton |
| 5,931,831 A | 8/1999 | Linder |
| 5,986,884 A | 11/1999 | Jairazbhoy et al. |
| 6,391,442 B1 | 5/2002 | Duvall et al. |

FOREIGN PATENT DOCUMENTS

| | | |
|---|---|---|
| FR | 2368529 | 10/1976 |
| GB | 1086003 | 10/1967 |

OTHER PUBLICATIONS

Power Devices, Inc.; "Low Thermal Resistance and Excellent Electrical Insulation in one Clean, Reliable System"; ISOSTRATE; (Not Dated).

Power Devices, Inc.; Adhesive-backed Aluminum Substrate with High Performance Thermal Compound in Easy-to-Use Form; MCM-STRATE; 1996.

Power Devices, Inc.; "The Cost-Effective Solution to Thermal Interface Problems—Clean, Dry and Easy to Use", THERMSTRATE; (Not Dated).

CHOMERICS; "THERMATTACH 404 and 405 Thermally Conductive Adhesive Tapes"; CHO-THERM Thermal Interface Materials; Technical Bulletin 72; 1993.

CHOMERICS; "THERMATTACH T413 and T414 Thermally Conductive Adhesive Tapes"; Preliminary Product Data Sheet; 1994.

CHOMERICS; "THERMFLOW T705 and T710 Low Thermal Resistance Interface Pads"; CHO-THERM Thermal Interface Material; Technical Bulletin 77; 1997.

The Bergquist Company; "SIL-PAD Design Guied", Spring 1993.

Print out from www.dupont.com website: "Thermal Properties of Elvax Measured by Differential Scanning Calorimeter (DSC)"; 1997.

PREAPPLIABLE PHASE CHANGE THERMAL INTERFACE PAD

This application is a continuation of U.S. patent application Ser. No. 09/572,353, filed May 17, 2000 and now U.S. Pat. No. 6,616,999, the entire contents of which are incorporated by reference herein.

BACKGROUND OF THE INVENTION

Interface systems for use in transferring heat produced from a heat-dissipating electronic component to a heat dissipator or heat sink are well-known in the art. In this regard such electronic components, the most common being computer chip microprocessors, generate sufficient heat to adversely affect their operation unless adequate heat dissipation is provided. To achieve this end, such interface systems are specifically designed to aid in the transfer by forming a heat-conducted pathway from the components to its mounting surface, across the interface, and to the heat sink.

Exemplary of such contemporary thermal interfaces are THERMSTRATE and ISOSTRATE (both trademarks of Power Devices, Inc. of Laguna Hills, Calif.). The thermstrate interface comprises thermally conductive, die-cut pads which are placed intermediate the electronic component and the heat sink so as to enhance heat conduction there between. The THERMSTRATE heat pads comprise a durable Type 1100 or 1145 aluminum alloy substrate having a thickness of approximately 0.002 inches (although aluminum and/or copper foil thicknesses may be utilized) that is coated on both sides thereof with a proprietary thermal compound, the latter comprising a paraffin base containing additives which enhance thermal conductivity, as well as control its responsiveness to heat and pressure. Such compound advantageously undergoes a selective phase-change insofar as the compound is dry at room temperature yet liquifies below the operating temperature of the great majority of electronic components, which is typically around 51° C. or higher, so as to assure desired heat conduction. When the electronic component is no long in use (i.e., is no longer dissipating heat), such thermal conductive compound re-solidifies once the same cools below 51° C.

The ISOSTRATE thermal interface is likewise a die-cut mounting pad that utilizes a heat-conducting polyimide substrate, namely, KAPTON (a registered trademark of DuPont) type MT, that further incorporates the use of a proprietary paraffin-based thermal compound utilizing additives to enhance thermal conductivity and to control its response to heat and pressure. Advantageously, by utilizing a polyimide substrate such interface is further provided with high dielectric capability.

The process for forming interfaces according to contemporary methodology is described in more detail in U.S. Pat. No. 4,299,715 issued on Nov. 10, 1991 to Witfield et.al. and entitled METHODS AND MATERIALS FOR CONDUCTING HEAT FROM ELECTRONIC COMPONENTS AND THE LIKE; U.S. Pat. No. 4,466,483 issued on Aug. 21, 1984 to Witfield et. al. and entitled METHODS AND MEANS FOR CONDUCTING HEAT FROM ELECTRONIC COMPONENTS AND THE LIKE; and U.S. Pat. No. 4,473,113 issued on Sep. 25, 1984 to Witfield et. al. entitled METHODS AND MATERIAL FOR CONDUCTING HEAT FROM THE ELECTRONIC COMPONENTS AND THE LIKE, the contents of all three of whch are expressly incorporated herein by reference.

The prior art of adhesively bonding a thermal interface to either the electronic component or the heat sink is likewise well-known. Such practice facilitates handling and expedites installation of the interface, as well as allows the heat conductive interface to be sold along with either the electronic component or the heat sink already in place there upon. According to contemporary practice, however, the use of an adhesive material to attach the heat conductive interface to either the electronic component or the heat sink is generally undesirable. In this regard, by introducing an additional layer to the interface system, namely in the form of adhesive, the ability of the interface to conduct the flow of heat thereacross is substantially reduced. As those skilled in the art will appreciate, the addition of a layer of material to an interface system, which is already typically compromised by virtue of its multi-layered construction, contributes three distinct impediments to heat flow, namely, each layer introduces the material of which the layer itself is comprised—across which the heat must be conducted—as well as creates two (2) interfaces at either surface of the adhesive layer.

Thus, it will be appreciated that it is highly desirable to minimize the number of layers, and consequently the number of interfaces, comprising an interface system. Along these lines, it has been found that the use of a thermal interface having six or more layers do not provide desirable heat transfer from a given electronic component to the heat sink coupled therewith. The use of an adhesive, and more particularly a layer thereof for affixing an interface system between and electronic component and heat sink further contributes to such inefficiency by introducing yet another layer at the electronic component/heat sink interface. Accordingly, there has been and continues to exist a recognized problem of finding methods to securably mount such interface systems in fixed position between an electronic component and a heat sink, particularly through the use of adhesives, without such adhesive layer extending across or otherwise obtruding upon the interface mating surface across which heat is conducted. Additionally, it should further be noted that from a practical standpoint, the manufacture of interface systems having multiple layers is known in the art to be expensive, and adding yet another layer of adhesive further compounds the expense and complexity associated with such interface fabrication processes.

As such, there is a considerable need in the art to provide a thermal interface having a minimal number of layers that provides adequate heat dissipation from an electronic component to a heat sink, but further utilizes an adhesive to attach the interface to either one of the electronic component or the heat sink coupled therewith. There is a further need in the art to provide a thermal interface which is adhesively bondable to either an electronic component or the heat sink coupled therewith which further does not substantially increase the manufacturing cost thereof, as opposed to contemporary interface pads. There is yet an additional need in the art for a thermal interface that, through the use of novel heat conductive compositions, is more effective in transferring and, hence, dissipating heat generated from an electronic component than prior art interfaces.

SUMMARY OF THE INVENTION

The present invention specifically addresses and alleviates the above-identified deficiencies. In this regard, the present invention is directed to a thermal interface that more effectively facilitates the transfer of heat from an electronic component to a heat sink than prior art interfaces that can further be adhesively bonded to such componentry without diminishing the ability of the interface to transfer heat thereacross. According to a preferred embodiment, the interface comprises a generally planar substrate, which preferable comprises a layer of foil having excellent thermal conductivity, such as aluminum. Formed upon the opposed sides of the substrate are layers of a heat-conducting material formulated to enhance heat transfer from the electronic component to the heat sink. Preferably, such heat-conducting material comprises a graphitic allotrope composition formulated in accordance to those graphitic allotrope compositions disclosed in Applicants' co-pending patent application entitled GRAPHITIC ALLOTROPE COMPOSITION INTERFACE AND METHOD OF FABRICATING THE SAME, Serial No. not yet assigned, the teachings of which are expressly incorporated herein by reference. In this regard, such heat-conducting material is comprised of a base of paraffin having quantities of graphite particles suspended therewithin such that the material exists in a solid phase at normal temperature, but melts when subjected to temperatures of approximately 51° C. or higher (which approximates the threshold temperature at which most electronic componentry operates).

To enable the interface of the present invention to be adhesively bonded to into position, the substrate is sized to overlap the interface mating surfaces between the electronic component and heat sink. Upon the portion of the substrate extending beyond the interface is formed a layer of adhesive that, by virtue of not being interposed between the heat sink and interface, is selectively positioned to facilitate adhesive bonding of the interface without interfering with heat transfer. To facilitate packaging and handling of the interface of the present invention, there may be provided one or more release or peel-away protective liners formed to the adhesive applied to the substrate. When in place, the protective liner, which may preferably comprise silicone-treated paper, prevents exposure of the adhesive, but when pulled away exposes the adhesive so as to facilitate adhesive bonding of the thermal interface. Advantageously, the thermal interface utilizes a minimal number of layers (i.e., three layers), that are present at the actual interface between the electronic component and the heat sink affixed thereto. The additional layer of adhesive used to bond the interface into position is kept away from the interface surface so as to not impede or otherwise interfere with the desired thermal conductivity.

It is therefore an object of the present invention to provide a thermal interface that may be adhesively secured in position relative to electronic component in a heat sink such that no portion of the adhesive becomes interposed therebetween.

Another object of the present invention is to provide an adhesively attachable thermal interface that utilizes a minimal number of layers in the construction thereof and further, utilizes novel heat-conductive materials that provide far superior heat conductivity than prior art interfaces.

Still further object of the present invention are to provide a thermal interface that may be adhesively secured in position relative to heat sink and an electronic component that is of simple construction, may be readily fabricated from commercially-available material, is relatively inexpensive to manufacture, and may be readily deployed with conventional electronic an heat sink componentry.

BRIEF DESCRIPTION OF THE DRAWINGS

These, as well as other features of the present invention, will become more apparent upon reference of the drawings wherein:

FIG. 1 is an exploded perspective view of a heat sink position for attachment to an electronic component further showing a pre-formed thermal interface pad constructed in accordance with a preferred embodiment of the present invention being disposed there between:

DETAILED DESCRIPTION OF THE PREFERRED EMBODIMENT

The detailed description set forth below in connection with the independent drawings is intended merely as a description of the presently preferred embodiment of the invention, is not intended not to represent the only form in which the present invention may be constructed or utilized. The description sets forth the functions and sequence of steps for construction in the limitation of the invention in connection with the illustrated embodiments. It is to be understood, however, that the same or equivalent functions and sequences may be accomplished by different embodiments that are also intended to be encompassed within the spirit and scope of the invention.

Figure 1:
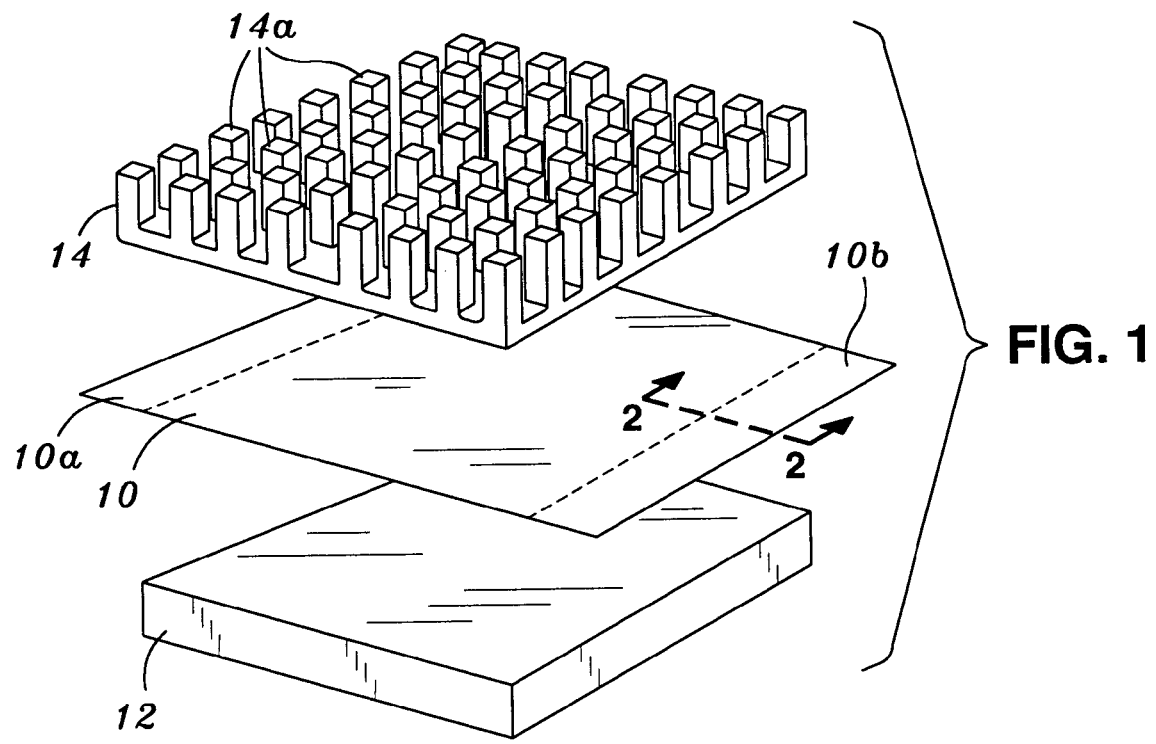

Referring now to the drawings, an initially to FIG. 1, there is shown a thermal interface 10 constructed in accordance to a preferred embodiment of the present invention. The thermal interface 10 is specifically designed and configured to facilitate the transfer of heat away from an electronic component 12 to a heat sink 14. In this regard, the thermal interface 10 is specifically designed and adapted to be interposed between the electronic component 12 and the heat sink 14. As is well-known, such heat sink 14 is provided with structures, such as fins or protuberances 14a, having sufficient surface area to dissipate the heat into the surrounding area. Although not shown, a fan is typically utilized to facilitate such heat dissipation by providing adequate air circulation over the fins or protuberances 14a. Preferably, the thermal interface 10 is die-cut or pre-formed to have a shape or footprint compatible with the particular electronic component and/or heat sink to thus enable the thermal interface 10 to maximize surface area contact at the juncture or mating surface between the electronic component 12 and the heat sink 14. Alternatively, it will be recognized that in certain applications the thermal interface 10 may be manually cut from a sheet of interface material so as to provide a custom fit between a given electronic component and heat sink.

Importantly, however, the thermal interface 10 will include at least one portion formed on the periphery thereof that extends beyond the juncture between the electronic component 12 and the heat sink 14. According to one preferred embodiment, such extended periphery will comprise two elongate strip portions 10a, 10b formed on opposed sides thereof which, as discussed more fully below, are provided with dedicated layers of adhesive to provide means for securing the thermal interface 10 of the present invention to the heat sink coupled therewith.

Figure 2:
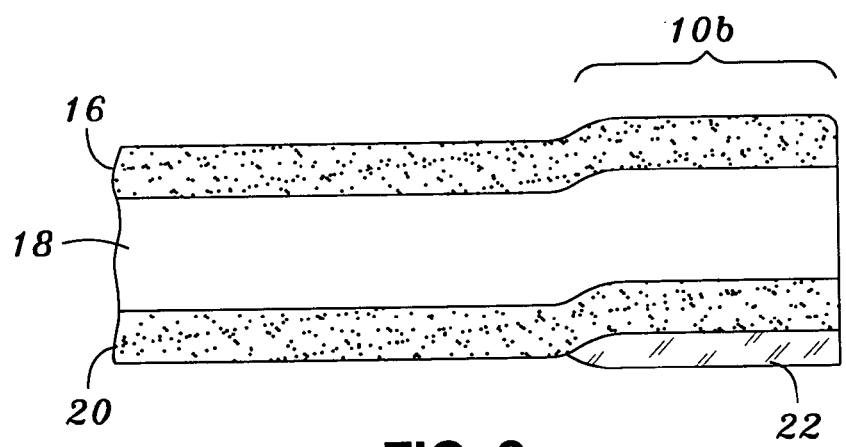
FIG. 2 is a cross-sectional view taken along line 2—2 of FIG. 1.

As illustrated in FIG. 2, the thermal interface 10 is comprised of three (3) layers 16, 18, 20. The middle or intermediate layer 18 consists of a generally planar substrate that is preferably fabricated from a metal foil, such as copper, gold, silver and/or aluminum, or any other metal having excellent thermal conductive properties. Because of its excellent heat conductive properties, coupled with its relatively lower cost, aluminum is considered a more highly preferred substrate. In a more highly preferred embodiment, such aluminum comprises 0.002 inch thick Type AL1145.

The external layers 16 and 20 of the interface 10 comprise a thermally conductive compound formulated to facilitate and enhance the ability of the interface 10 to transfer heat away from the electronic component to the heat sink. Such layers of thermally conductive compound preferably comprised the novel graphitic allotrope interface compositions disclosed in Applicants' co-pending patent application entitled GRAPHITIC ALLOTROPE INTERFACE COMPOSITIONS AND METHOD OF FABRICATING THE SAME, Serial No. not yet assigned, the teachings of which is expressly incorporated herein by reference. In this regard, such thermally conductive interface compounds are specifically designed and formulated to have substantially greater durability than prior art compounds and, as such enable such interfaces to be utilized and incorporated in remote electronic component manufacturing processes, which can enable such componentry to be shipped without incurring substantial labor costs.

As extensively discussed in Applicants' co-pending application, the thermally conductive interface compound which preferably comprises layers 16 and 20 are formulated from a base of paraffin having quantities of graphite particles suspended therewithin. Preferably, the paraffin component is present in an amount from 60% to 90% by weight, whereas the graphite particles are present in the amount from 10% to 40% by weight. In a more highly preferred embodiment, the graphite component is present in amount of approximately 35% by weight. As will be understood by those skilled in the art, the percentages of the two (2) components above will total 100% by weight. Moreover, if other materials are included in the formulation, the percentages of all ingredients will still total 100% by weight.

The graphite component preferably comprises high grade commercial graphite powder. The graphite preferably exists as spherical particles having a diameter of 6 microns or less. Among the types of commercially available graphite powder suitable for practice of the present invention include KS-6, produced by Timcal America, Inc. of Westlake, Ohio.

The paraffin component of the composition of the thermal composition may be of standard commercial grade. Preferably, the paraffin component comprises 51° C. paraffin wax which, as will be known to those skilled in the art, constitutes a grade of paraffin having a specific melting point (i.e., 51° C.). By utilizing 51° C. paraffin wax, the thermal composition will have a melting point of approximately 50° to 61° C., which will thus correspond to the temperature at which the composition transitions from its solid phase to its molten, liquid phase.

Advantageously, such melting point is selected to be below the temperature at which most electronic components operate. In this regard, such thermal composition will only assume the liquid state during the operation of the electronic component, and only during such time as the component operates at such elevated temperatures. As a result, interface surface wetting action is achieved and heat transfer efficiency for the component is enhanced forevermore of the life of the component across its full operating temperature range.

Although the compositions of the present invention preferably utilize paraffin exclusively as the base compound, petrolatum may additionally be blended with the paraffin to thus form a resultant base compound having a desired hardness or softness, as may be advantageous for a given application. Preferably, the paraffin and petrolatum components will be blended together such that the ratio of such components (i.e., paraffin to petrolatum) is between approximately 1.0:0 to 3.0:1 by percent weight. In this regard, as the petrolatum component is increased relative the paraffin component, the resultant composition will correspondingly be caused to increase in softness.

As will be appreciated, in any formulation the compositions of the present invention will have the desired phase change property of remaining in a solid phase while in the range of normal room temperature, but as the temperature rise will become plastic. Thereafter, the composition will become molten at higher temperatures, as will be encountered by the composition when applied to the interface between the heat-dissipating component and a heat sink. In this respect, by assuming a liquid state during operation of the electric component, the thermally conductive composition of the present invention will be able to fill those voids or air gaps existing at the interface between the component and the heat sink and will thus provide for better contact, and thus better heat conduction versus the condition of poor heat conduction if such voids or gaps were not otherwise filled.

It will additionally be recognized, however, that although paraffin, and to a lesser extent a mixture of paraffin and petrolatum, are discussed as preferred components of the composition of the present invention, numerous other natural or synthetic materials, for example, waxes or fats, may be suitable for the present invention. Representative of such suitable materials include, but are by no means limited to, beeswax, palm wax, mineral waxes, and/or glycerin, either alone or in combination. It should further be recognized that certain vegetable oils may also serve as a component of the thermally conductive composition of the present invention.

In order to impart greater durability and ruggedness to the composition, as is typically desired when taking into account manufacturing and shipping considerations for electronic devices, the thermal compositions may further include a polymer material, and in particular a synthetic resinous plastic material such as ELVAX®, a registered trademark of E.I. DUPONT DE NEMORES & COMPANY of Wilmington, Del. Such synthetic material may be present in an amount up to 5% of the weight of the final composition. According to a more highly preferred embodiment, such plastic material may be present in the amount of approximately 2% by weight.

In any formulation, the thermal composition comprising outer layers 16, 20 will preferably be applied such that the same are approximately 0.00065 inches thick. As will be appreciated by those skilled in the art, however, the thickness of such layers 16, 20 may be adjusted to suit one or more particular applications.

In order to enable the interface 10 to be adhesively bonded into position relative the electronic component and heat sink, there is formed upon extended periphery or strip portions 10a, 10b of the interface 10 are dedicated layers of adhesive, such as 22 formed upon strip portion 10b shown in FIG. 2. In this regard, the extended periphery of interface 10, namely, strip portions 10a, 10b, with adhesive formed on a respective side thereof will be specifically sized and formed such that such extended periphery and adhesive layer formed thereon will extend beyond the interface or mating surface between the electronic component and heat sink such that the layer of adhesive 22 does not at any time become interposed therebetween. As such, the thermal interface 10 of the present invention allows for an optimal transfer heat from an electronic component to a heat sink coupled thereto that further enables the thermal interface to be adhesively secured in position therebetween, which thus provides substantial installation and manufacturing advantages accorded to adhesive attachment techniques. As will be appreciated, the adhesive utilized in the practice of the present invention may take any of a variety of adhesives well-known to those skilled in the art. As will further be appreciated, however, such adhesive is provided only for the convenience of mounting such interface 10 into position relative in electronic component and a heat sink, and is not required for operation of the thermal interface. Notwithstanding, to the extent any type of adhesive is utilized in the practice of the present invention, it should be expressly recognized that for optimal performance such adhesive must be so applied to the interface system such that the same in no way encroaches upon or otherwise becomes introduced at the thermal interface between the electronic component and heat sink, which is typical of prior art interface systems.

Moreover, in order to preserve the integrity of the adhesive prior to application on the interface 10, it will be understood that one or more release liners (not shown) may be utilized to facilitate the packaging and handling of such interface. In this respect, it is contemplated that such liners may be peeled or pulled away from the thermal interface 10 prior to the deployment thereof. As will be recognized, such liners may comprise silicone-coated paper and the like, which can easily be peeled away.

As will be recognized by those skilled in the art, the interface 10 of the present invention, because of its novel construction, will only have three layers of material at the interface between the electronic component and the heat sink, namely, the first layer thermal compound 16, substrate 18, and second layer of thermal compound 20, as illustrated in FIG. 2. Such construction, due to the minimal amount of layers utilized, is specifically configured for optimal heat transmission therethrough, and thus is ideally suited for application as a thermal interface for facilitating heat transfer from an electronic component to a heat sink. As those skilled in the art will further appreciate by eliminating additional layers of material, which are typically present in prior art interfaces, there is thus facilitated the performance of heat transfer from the electronic component to a heat sink. As discussed above, it is well-known that the rate of heat transfer through such interfaces are reduced by each layer added thereto. Moreover, due to the enhanced thermal transfer capabilities provided by the novel thermal compositions discussed herein and in Applicants' co-pending patent application, there is yet further enhanced the ability of the interface 10 of the present invention to conduct heat thereacross.

Of still further advantage, because the interface 10 of the present invention incorporates a layer of adhesive formed upon a portion of the periphery thereof that extends beyond the interface mating surface between the electronic component and heat sink, there is advantageously provided means for securing the interface 10 into position without having to incorporate the use of prior art attachment mechanisms, such as clips, clamps, fasteners, or other devices that must necessarily be utilized to assure adequate contact of the heat sink and electronic device at the interface thereof, as well assure that the heat sink remains reliably attached to the electronic component. It should be understood, however, that such prior art attachment devices can be utilized in combination with the thermal interface of the present invention to the extent so desired.

Although the invention has been described here and with specific reference to the preferred embodiment thereof, it will be appreciated by those skilled in the art that there is modifications, deletions, and alterations may be made to such preferred embodiment without departing from the spirt and scope of the invention. For example, it will be recognized that the extended, oversized portion of the peripheral edge of the interface 10 upon which the adhesive is applied may be formed anywhere about the periphery of such interface 10 to thus enable the same to be advantageously secured into position for a particular application. Accordingly, it is intended that all reasonably foreseeable additions, modifications, deletions and alterations be included within the scope of the invention as defined in the following claims:

What is claimed is:

1. A thermal interface positionable at a juncture between an electronic component and a heat sink for facilitating heat transfer from said electronic component to said heat sink comprising:
   a) a substantially planar substrate consisting essentially of a single layer having first and second surfaces and defining a first continuous peripheral edge, said peripheral edge having a portion thereof extending beyond the juncture between said electronic component and said heat sink;
   b) a first layer of a heat conductive composition formed substantially about said first surface of said substrate, and a second layer of a heat conductive composition formed substantially about said second surface of said substrate, said first and second layers further being formed upon said portion of said substrate extending beyond said juncture between said electronic component and said heat sink; and
   c) a layer of adhesive formed upon a portion of a respective one of said layers of heat conductive material, said adhesive layer being localized upon said portion of said peripheral edge defined by said substantially planar substrate extending beyond said juncture between said electronic component and said heat sink, wherein said heat conductive composition comprises 60 to 90% by weight of paraffin and 10 to 40% by weight of graphite.

2. The thermal interface of claim 1 wherein said substrate comprises a thermally conductive metal foil.

3. The thermal interface of claim 2 wherein said foil is selected from the group consisting of copper, gold, silver and aluminum.

4. The thermal interface of claim 1 further comprising:
   peel-away protective layer formed to said adhesive, wherein peeling away said peel-away layer exposes said layer of adhesive on said substrate so as to facilitate adhesive bonding of said thermal interface to said heat sink.

5. A thermal interface positionable at a juncture between an electronic component and a heat sink for facilitating heat transfer from said electronic component to said heat sink comprising:
   a) a substantially planar substrate consisting essentially of a single layer having first and second surfaces and defining a first continuous peripheral edge, said peripheral edge having a portion thereof extending beyond the juncture between said electronic component and said heat sink;
   b) a first layer of a heat conductive composition formed substantially about said first surface of said substrate, and a second layer of a heat conductive composition formed substantially about said second surface of said substrate, said first and second layers further being formed upon said portion of said substrate extending beyond said juncture between said electronic component and said heat sink and formulated to have a melting point of approximately 51° C.–60° C., and c) a layer of adhesive formed upon a portion of a respective one of said layers of heat conductive material, said adhesive layer being localized upon said portion of said peripheral edge defined by said substantially planar substrate extending beyond said juncture between said electronic component and said heat sink, wherein said heat conductive composition comprises 60 to 90% by weight of paraffin and 10 to 40% by weight of graphite.

6. The thermal interface of claim 5 wherein said substrate comprises a thermally conductive metal foil.

7. The thermal interface of claim 6 wherein said foil is selected from the group consisting of copper, gold, silver and aluminum.

8. The thermal interface of claim 5 further comprising:
peel-away protective layer formed to said adhesive, wherein peeling away said peel-away layer exposes said layer of adhesive on said substrate so as to facilitate adhesive bonding of said thermal interface to said heat sink.

9. A method for facilitating the transfer of heat from an electronic component to a heat sink across an interface therebetween, the method comprising the steps:

a) providing a thermal interface positionable between said electronic component and said heat sink, said thermal interface comprising:
  (i) a substantially planar substrate consisting essentially of a single layer having first and second surfaces and defining a first continuous peripheral edge, said peripheral edge having a portion thereof extending beyond the juncture between said electronic component and said heat sink;
  (ii) a first layer of a heat conductive composition formed substantially about said first surface of said substrate, and a second layer of a heat conductive composition formed substantially about said second surface of said substrate, said first and second layers further being formed upon said portion of said substrate extending beyond said juncture between said electronic component and said heat sink; and
  (iii) a layer of adhesive formed upon a portion of a respective one of said layers of heat conductive material, said adhesive layer being localized upon said portion of said peripheral edge defined by said substantially planar substrate extending beyond said juncture between said electronic component and said heat sink;

b) interposing the thermal interface provided in step (a) between said electronic component and said heat sink such that said layer of adhesive extends beyond said juncture between said electronic component and said heat sink; and c) compressively engaging said electronic component to said heat sink with said thermal interface disposed therebetween, wherein said heat conductive composition comprises 60 to 90% by weight of paraffin and 10 to 40% by weight of graphite.

10. The method of claim 9 wherein in step (a), said first and second layers of heat conductive composition have a melting point of approximately 51° C. to 60° C.

11. The method of claim 9 wherein step (b) further comprises adhesively attaching said layer of adhesive to a portion of said heat sink extending beyond said juncture between said electronic component and said heat, sink.

12. The method of claim 9 wherein in step (a), said substantially lanar substrate of said thermal interface comprises a thermally conductive metal foil.

13. The method of claim 12 wherein said foil is selected from the group consisting of copper, gold, silver and aluminum.

* * * * *